(12) United States Patent
Taeuber et al.

(10) Patent No.: US 7,864,593 B2
(45) Date of Patent: Jan. 4, 2011

(54) METHOD FOR CLASSIFYING MEMORY CELLS IN AN INTEGRATED CIRCUIT

(75) Inventors: Andreas Taeuber, Unterschleissheim (DE); Detlev Richter, Munich (DE); Luca De Ambroggi, Munich (DE); Konrad Seidel, Dresden (DE); Robert Petter, Wandlitz (DE); Marco Ziegelmayer, Freital (DE)

(73) Assignee: Qimonda AG, Munich (DE)

( * ) Notice: Subject to any disclaimer, the term of this patent is extended or adjusted under 35 U.S.C. 154(b) by 551 days.

(21) Appl. No.: 11/786,765

(22) Filed: Apr. 12, 2007

(65) Prior Publication Data

US 2008/0253217 A1     Oct. 16, 2008

(51) Int. Cl.
*G11C 16/04*     (2006.01)
(52) U.S. Cl. .......................... 365/185.24; 365/210.12; 365/230.06; 365/230.08
(58) Field of Classification Search ............ 365/185.23, 365/189.02, 230.02, 185.24, 210.12, 230.06, 365/230.08
See application file for complete search history.

(56) References Cited

U.S. PATENT DOCUMENTS

| | | | | |
|---|---|---|---|---|
| 4,758,989 | A * | 7/1988 | Davis et al. ................. | 714/766 |
| 5,278,785 | A * | 1/1994 | Hazani ................... | 365/185.16 |
| 6,166,957 | A * | 12/2000 | Chung et al. ........... | 365/185.23 |
| 6,343,045 | B2 * | 1/2002 | Shau .......................... | 365/227 |
| 6,826,074 | B2 * | 11/2004 | Yamauchi .................... | 365/154 |
| 6,862,236 | B2 * | 3/2005 | Maruyama .................. | 365/202 |
| 2006/0126382 | A1 | 6/2006 | Maayan et al. | |
| 2007/0030741 | A1 * | 2/2007 | Nii et al. ................ | 365/189.11 |
| 2007/0211537 | A1 * | 9/2007 | Park et al. .............. | 365/185.22 |

* cited by examiner

*Primary Examiner*—Pho M Luu

(57) ABSTRACT

A method for classifying memory cells in an integrated circuit is provided, wherein the integrated circuit has a memory cell field including a plurality of memory cells. The method includes determining, for each subset of the memory cells of a plurality of subsets of the memory cells, a threshold voltage distribution; determining whether the determined threshold voltage distributions fulfill a threshold voltage criterion; and depending on whether the determined threshold voltage distributions fulfill the threshold voltage criterion, classifying at least some of the non-selected memory cells.

27 Claims, 9 Drawing Sheets

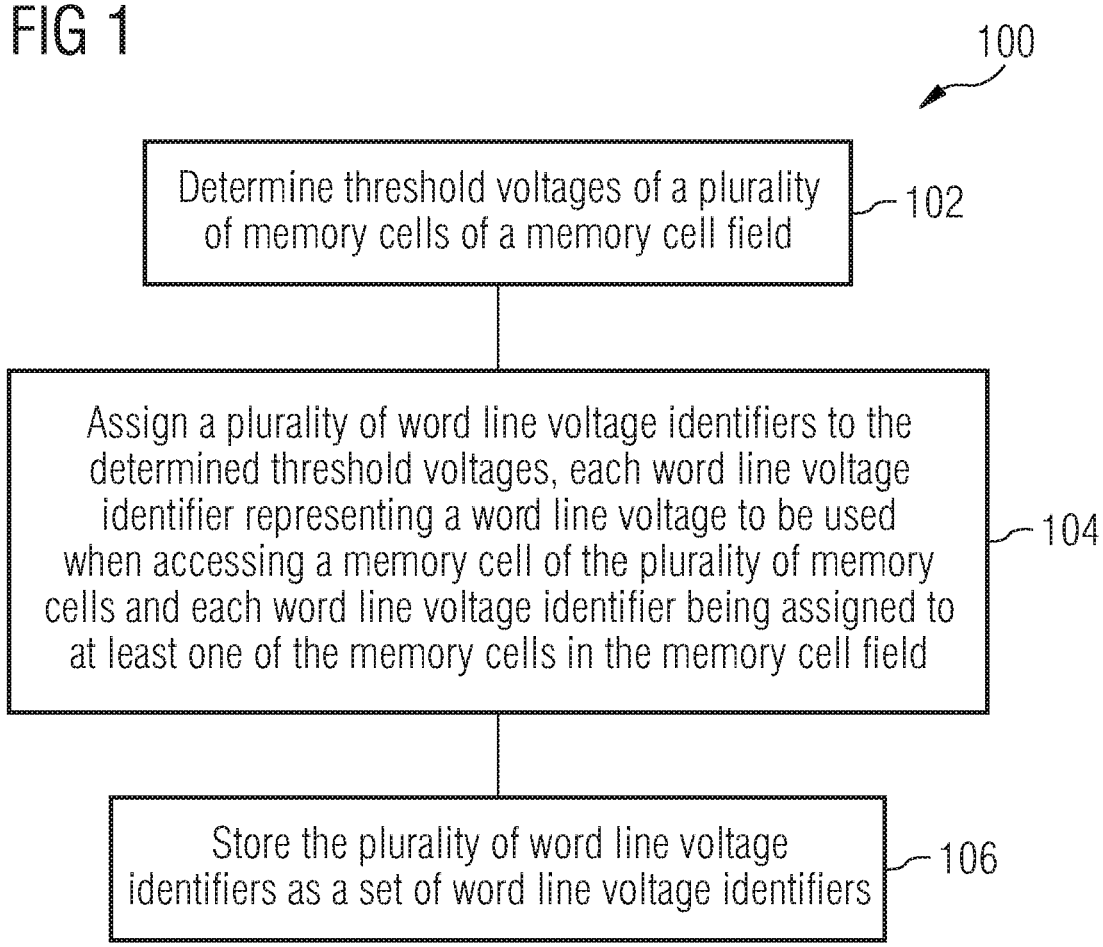
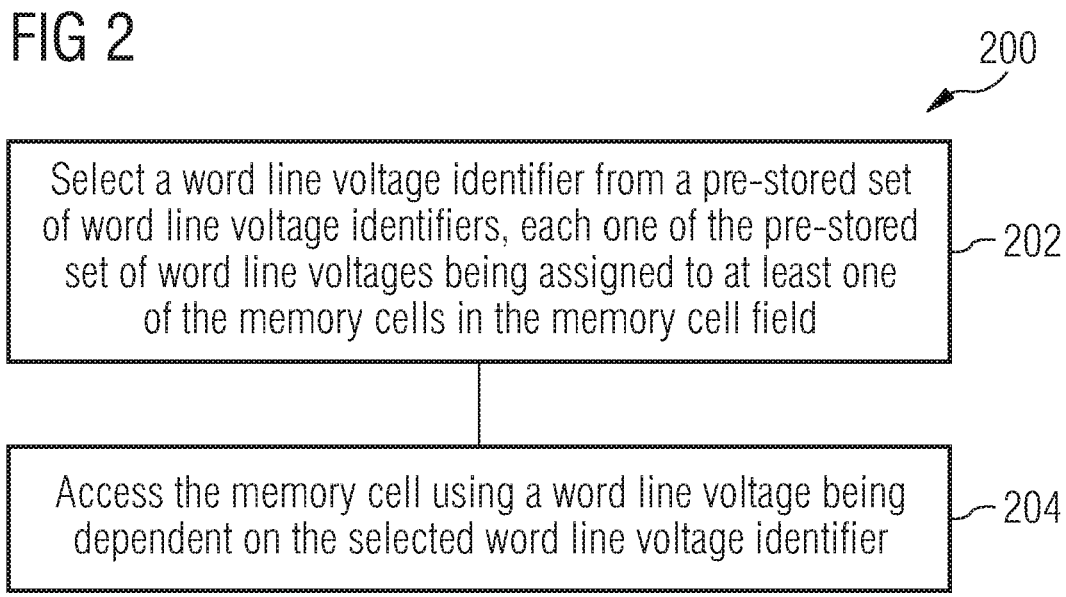

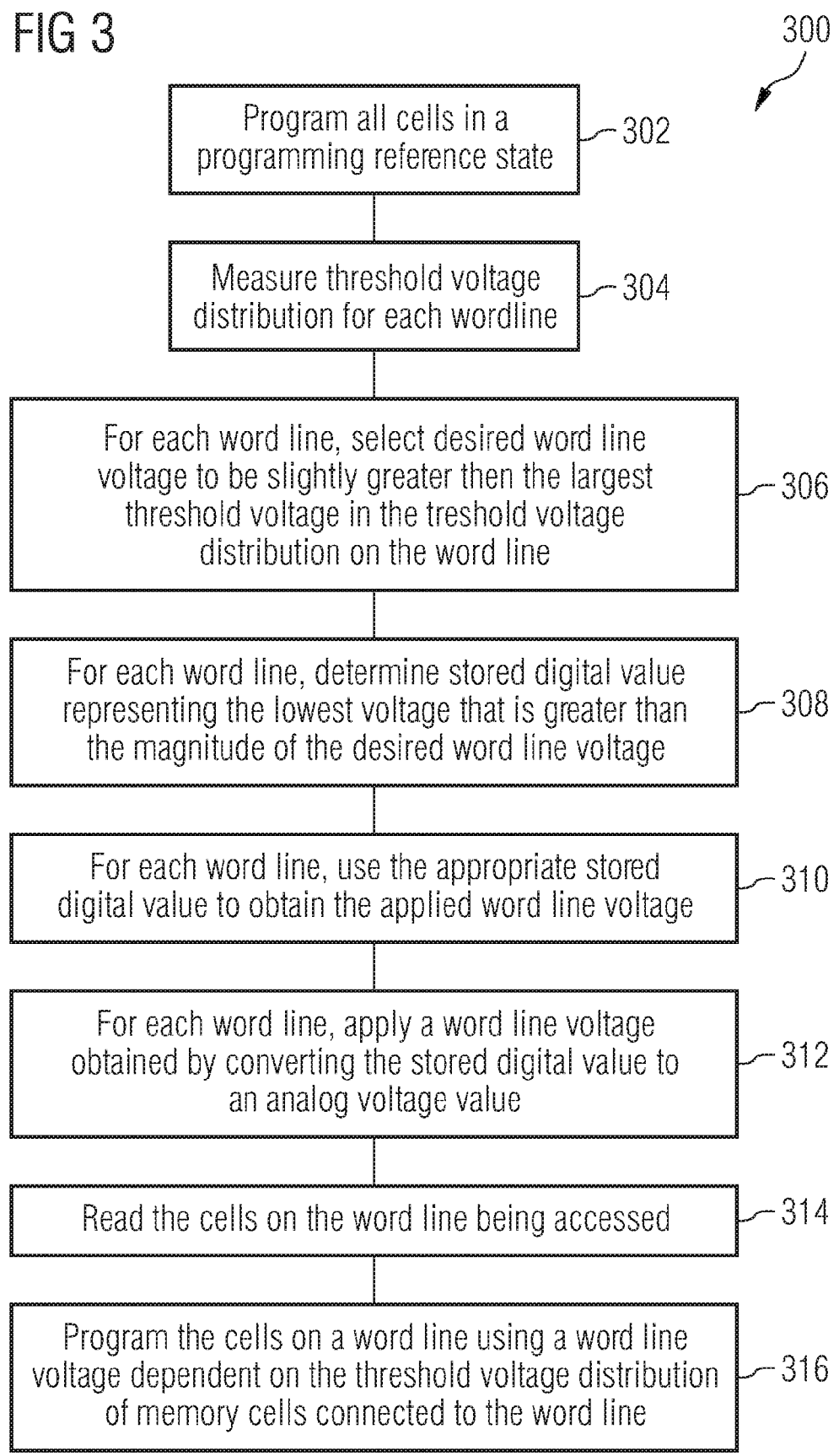

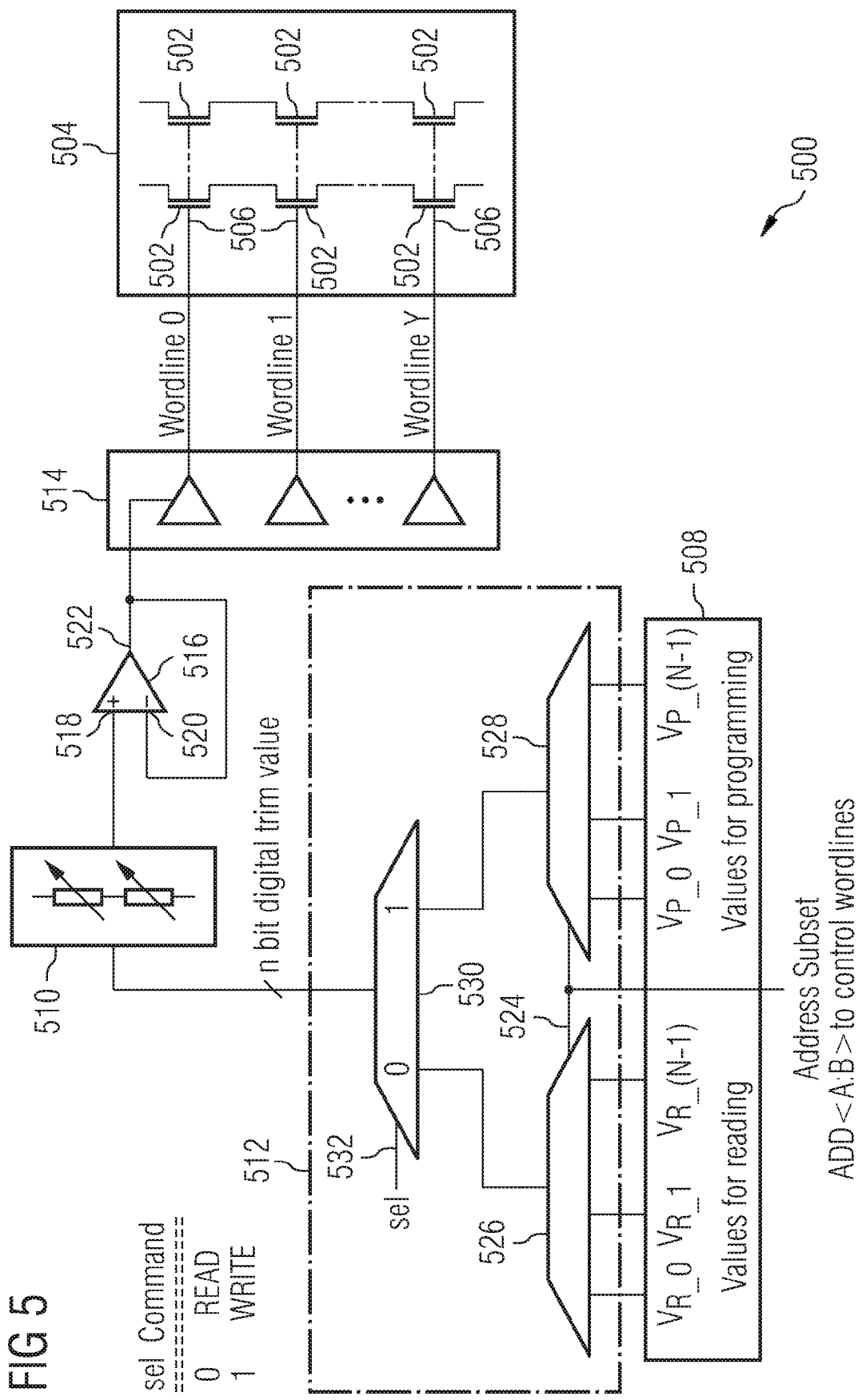

METHOD FOR CLASSIFYING MEMORY CELLS IN AN INTEGRATED CIRCUIT

TECHNICAL FIELD

Embodiments of the invention relate to a method for accessing a memory cell in an integrated circuit, a method of determining a set of word line voltage identifiers in an integrated circuit, a method for classifying memory cells in an integrated circuit, a method for determining a word line voltage for accessing a memory cell in an integrated circuit and integrated circuits.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 is a flow diagram of a method of determining a set of word line voltage identifiers in an integrated circuit in accordance with an exemplary embodiment of the invention;

FIG. 2 is a flow diagram of a method of accessing a memory cell in a memory cell field in an integrated circuit in accordance with an exemplary embodiment of the invention;

FIG. 3 is a block diagram showing a method of accessing a plurality of memory cells of a memory cell array in an integrated circuit in accordance with an exemplary embodiment of the invention;

FIG. 5 is a schematic diagram showing an integrated circuit for accessing a plurality of memory cells in accordance with an exemplary embodiment of the invention;

DETAILED DESCRIPTION OF ILLUSTRATIVE EMBODIMENTS

Figure 4A:
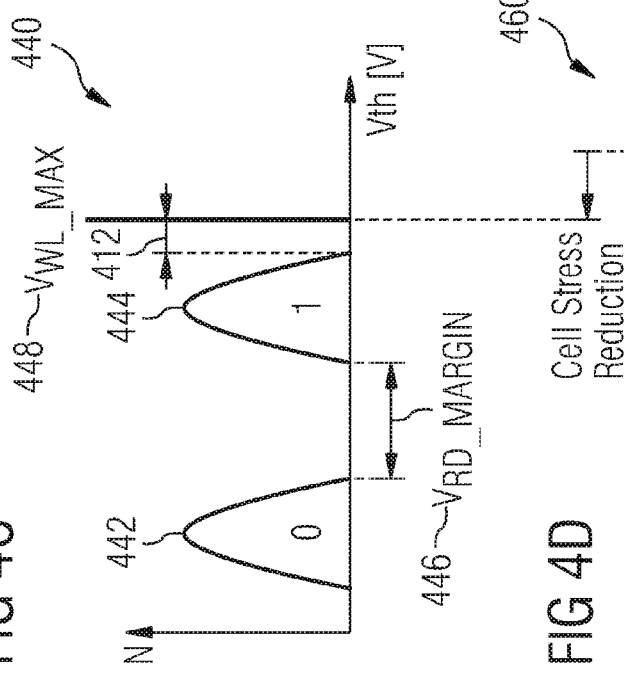
FIGS. 4A to 4D show exemplary threshold voltage distributions for different memory cells in an integrated circuit in accordance with an exemplary embodiment of the invention.

Identical reference numerals are used for similar or identical elements in the figures, where appropriate. The figures are schematic and not to scale.

As used herein the terms connected and coupled are intended to include both direct and indirect connection and coupling, respectively.

As used herein the term "multibit" memory cell is intended to, e.g., include memory cells which are configured to store a plurality of bits by spatially separated electric charge storage regions, thereby representing a plurality of logic states.

As used herein the term "multi level" memory cell is intended to, e.g., include memory cells which are configured to store a plurality of bits by showing distinguishable threshold voltages dependent on the amount of electric charge stored in the memory cell, thereby representing a plurality of logic states.

When reading memory cells, for example, non-volatile memory cells of a FLASH memory cell array, one word line voltage has been used for reading all of the memory cells of the memory cell array. The threshold voltage of each memory cell in the memory cell array is measured and the magnitude of the word line voltage used for reading is set larger than the largest threshold voltage that is measured. Thus the memory cell exhibiting the largest threshold voltage determines the value of the word line voltage used to read all of the memory cells of the memory cell array.

FIG. 1 illustrates a flow diagram 100 of a method of determining a set of word line voltage identifiers in an integrated circuit in accordance with an exemplary embodiment of the invention.

At 102, threshold voltages of a plurality of memory cells of a memory cell field are determined. The memory cell field is included in an integrated circuit. In one embodiment of the invention, the threshold voltages are individually measured memory cell by memory cell.

At 104, a plurality of word line voltage identifiers are assigned to the determined threshold voltages, each word line voltage identifier representing a word line voltage to be used when accessing a memory cell of the plurality of memory cells and each word line voltage identifier being assigned to at least one of the memory cells in the memory cell field. In one embodiment of the invention, a word line voltage identifier is used that is assigned to at least one memory cell of the memory cell field, e.g., to at least one word line of the memory cell field. Furthermore, a respective word line voltage is assigned to the word line voltage identifier, wherein the word line voltage should be used to access the memory cell that is uniquely identified by means of the identifier.

At 106, the plurality of word line voltage identifiers are stored as a set of word line voltage identifiers. In one embodiment of the invention, as will be described in more detail below, the word line voltage identifiers may be stored as a digital value in a non-volatile memory such as a flash memory, e.g., a floating gate memory or a charge trapping memory. In one embodiment of the invention, the word line voltage identifiers may be stored in a one-time programmable memory (OTP). It should be mentioned that any other suitable type of memory, e.g., non-volatile memory may be used in an alternative embodiment of the invention.

FIG. 2 illustrates a flow diagram 200 of a method of accessing a memory cell in a memory cell field in an integrated circuit in accordance with an exemplary embodiment of the invention.

In one embodiment of the invention, the method uses the pre-stored word line voltage identifiers that have been determined in accordance with the method described with reference to FIG. 1.

In one embodiment of the invention, in the method of accessing a memory cell in a memory cell field having a plurality of memory cells, at 202, a word line voltage identifier is selected from a pre-stored set of word line voltage identifiers, each one of the pre-stored set of word line voltage identifiers being assigned to at least one of the memory cells in the memory cell field.

At 204, accessing the memory cell using a word line voltage may be dependent on the selected word line voltage identifier. The access may be a read access, thereby reading the content of an addressed memory cell or a write access, thereby writing data into an addressed memory cell. The writing may be understood as programming useful data or instruction code data into the respectively addressed memory cell as well as erasing the content of the respectively addressed memory cell, in other words, writing a predetermined erase state into the respectively addressed memory cell.

FIG. 3 is a block diagram 300 showing a particular embodiment of a method of accessing a plurality of memory cells of a memory cell array, for example, a FLASH memory cell array.

Processes 302 and 304 involve measuring a plurality of threshold voltage distributions.

At 302, all of the memory cells of a non-volatile memory cell array, for example, a FLASH memory cell array, are programmed, e.g., to a common predetermined programming reference state, e.g., a high resistance state or a low resistance state or another predetermined reference resistance state.

The memory cells may be floating gate memory cells or charge trapping memory cells. One example of a charge trapping memory cell is an oxide-nitride-oxide (ONO) memory cell, which is also referred to as nitrided read only memory (NROM). In an alternative embodiment, the charge trapping memory cell may include a stack of two, three, four or even more dielectric layers being stacked one above the other, the electric charges being trapped in one of the dielectric layers. Furthermore, the memory cells can be magnetoresistive random access memory cells (MRAM), ferroelectric random access memory cells (FRAM), organic random access memory cells (ORAM), conductive bridging random access memory cells (CBRAM), phase change memory cells (PCM). In general, the embodiments of the invention can be applied to any type of memory cell, in which a threshold voltage differs from memory cell to memory cell in a memory cell field.

As will be described in more detail below, the memory cells are arranged in a memory cell field such as a memory cell array. The memory cells may be arranged in rows and columns. However, any other kind of architecture may be used in an alternative embodiment of the invention, such as a zig-zag arrangement of the memory cells within the memory cell field.

In one embodiment of the invention, each memory cell may be formed by at least one transistor, e.g., a field effect transistor. In one embodiment of the invention, the memory cell field includes a plurality of control lines providing control signals to the memory cell. In one embodiment of the invention, the plurality of control lines include word lines, which may be coupled to the gate region of the respective field effect transistor, and bit lines, which may be coupled to the source/drain regions of the respective field effect transistor.

At 304, a plurality of read operations on the memory cells connected to a particular word line are performed. In other words, the word line voltage used to read the memory cells connected to the particular word line is increased in steps until a programmed reference value is read for each of the memory cells connected to that word line. When a programmed reference value is read from a particular memory cell for the first time, one knows that the threshold voltage for that memory cell has been met or exceeded, and the word line voltage that has been applied can be used as an estimate for the threshold voltage of that memory cell. After a programmed reference value has been read from all of the memory cells connected to the particular word line, the threshold voltage distribution of the memory cells connected to that word line is known. A read operation is performed for each word line so that a distinct threshold voltage distribution is obtained for the memory cells connected to each word line. In an alternative embodiment of the invention, when multibit memory cells are provided in the memory cell field, different reference read operations may be performed on the memory cells connected to a particular word line, which are appropriate for multibit memory cells to determine their programmed reference values. In general, in other embodiments of the invention, any other suitable type of reference read operations can be performed on the memory cells connected to a particular word line depending on the memory cell type used and/or depending on the memory cell field architecture used. The further processes of this embodiment will be illustrated in more detail below.

In an embodiment of the invention, error detection and/or error correction codes may be used to protect the content stored in the memory cells.

FIGS. 4A to 4D illustrate different threshold voltage distributions of differently classified and used charge trapping memory cells. The charge trapping memory cells are located within the same memory cell field on the same die. The memory cells which are taken into account in each respective diagram with threshold voltage distribution described in the following are controlled via the same word line, respectively. In other words, each diagram showing the threshold voltage distribution characterizes the memory cells of one particular word line or of a plurality of word lines showing a similar characteristic.

FIG. 4A shows a first diagram 400 illustrating the measured threshold voltages (in the FIGS. 4A to 4D denoted with $V_{th}$, measured in [V]) of a first type of charge trapping memory cell. As can be gathered from FIG. 4A, four distinguishable first threshold voltage distributions 402, 404, 406, 408 can be realized with this kind of charge trapping memory cell. Since the four first threshold voltage distributions 402, 404, 406, 408 can be distinguished from one another, each of the first threshold voltage distributions 402, 404, 406, 408 is assigned to one logical information item (e.g. logic "00", logic "01", logic "10", logic "11"). In other words, four different memory cell states can be programmed and detected in this kind of memory cell. Thus, it is possible to store two bits into this kind of memory cell, which is therefore also referred to as a multi level cell. The memory cells of FIG. 4A further exhibit relatively narrow first threshold voltage distributions 402, 404, 406, 408 which show a high reliability of these memory cells. In order to distinguish the memory cells' programming states, a sufficiently large first read margin (in FIG. 4A denoted with $V_{RD\_MARGIN}$ 410), in which the read voltage may be selected, should be provided. A first read and verify voltage $V_{WL\_MAX}$ 414 that is used for read and verify operations is selected such that it is at least as high as the largest magnitude threshold voltage in the threshold voltage distribution 408 with the highest threshold voltages plus a security margin 412.

Figure 4B:
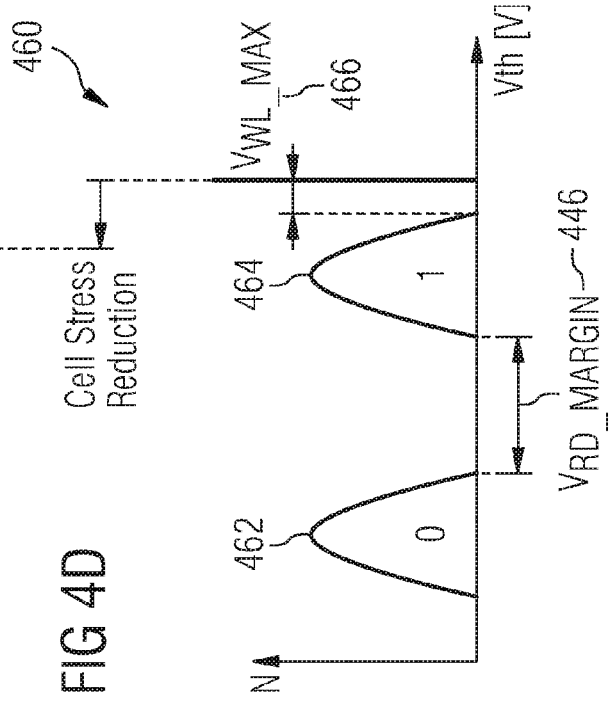

FIG. 4B shows a second diagram 420 illustrating the measured threshold voltages of a second type of charge trapping memory cell in the same memory field as the memory cells taken into account in the first diagram of FIG. 4A. As can be gathered from FIG. 4B, also four distinguishable second threshold voltage distributions 422, 424, 426, 428 can be realized with this kind of charge trapping memory cell, since the charge trapping memory cells are also of a sufficiently high quality. Since the four second threshold voltage distributions 422, 424, 426, 428 can be distinguished from one another, each of the second threshold voltage distributions 422, 424, 426, 428 is also assigned to one logical information item (e.g., logic "00", logic "01", logic "10", logic "11"). In other words, four different memory cell states can be programmed and detected in this kind of memory cells. Thus, it is possible to store two bits into this kind of memory cell, which is therefore also referred to as a multi level cell. The memory cells of FIG. 4B further exhibit broader second threshold voltage distributions 422, 424, 426, 428 than the first threshold voltage distributions 402, 404, 406, 408 of the memory cells classified in the first diagram 400, thereby showing a relatively lower quality of these memory cells classified in the second diagram 420 of FIG. 4B as compared with the memory cells classified in the first diagram 400. In order to distinguish the memory cell programming state, a sufficiently large first read margin, which is usually the same for all multi level cells, should be provided. Thus, as is shown in FIGS. 4A and 4B, due to the broader second threshold voltage distributions 422, 424, 426, 428 with using the same read margin and the same security margin 412, the second read and verify voltage $V_{WL\_MAX}$ 430 which should at least be provided for the memory cells of FIG. 4B is higher than the first read and verify voltage $V_{WL\_MAX}$ 414 used for reading/verifying the memory cells of FIG. 4A.

Conventionally, as described above, in this case, the second read and verify voltage $V_{WL\_MAX}$ 430 was used for reading/verifying the memory cells of FIG. 4A as well as for reading/verifying the memory cells of FIG. 4B. In contrast thereto, in accordance with one embodiment of the invention, this difference in the type of threshold voltage distributions for different memory cells in a memory cell field is used for reducing the memory cell stress due to the word line voltage. This is achieved in one embodiment of the invention by taking into account the difference between the first read and verify voltage $V_{WL\_MAX}$ 414 required for reading/verifying the memory cells classified into a first memory cell class, threshold voltage distributions 402, 404, 406, 408 of which are, e.g., shown in the first diagram 400 in FIG. 4A and the second read and verify voltage $V_{WL\_MAX}$ 430 required for reading/verifying the memory cells classified into a second memory cell class, threshold voltage distributions 422, 424, 426, 428 of which are, e.g., shown in the second diagram 420 in FIG. 4B. In other words, in one embodiment of the invention, the memory cells classified into the first memory cell class are read/verified using a lower word line voltage (e.g., the first read and verify voltage $V_{WL\_MAX}$ 414) than the memory cells classified into the second memory cell class, which are read/verified using a higher word line voltage (e.g., the second read and verify voltage $V_{WL\_MAX}$ 430). Thus, the memory cells having the narrower first threshold voltage distributions 402, 404, 406, 408 are accessed with lower word line voltages, thereby reducing their memory cell stress.

Figure 4C:
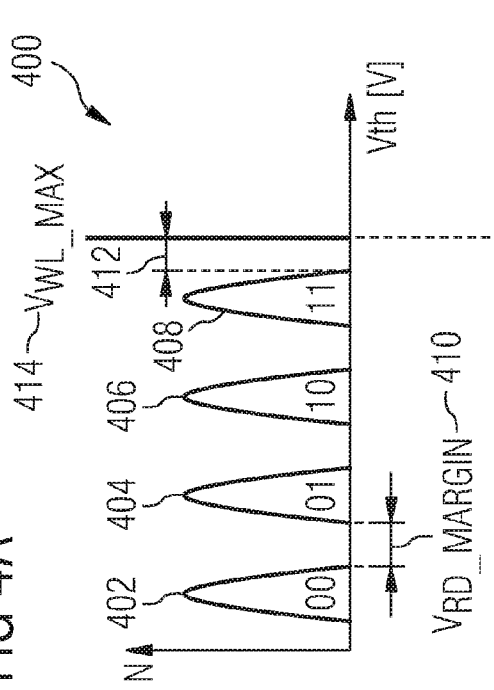

FIG. 4C shows a third diagram 440 illustrating the measured threshold voltages of a third type of charge trapping memory cell in the same memory cell field as the memory cells taken into account in the first diagram of FIG. 4A and the second diagram 420 of FIG. 4B. As can be gathered from FIG. 4C, two distinguishable third threshold voltage distributions 442, 444 can be realized with this kind of charge trapping memory cell. Since the two third threshold voltage distributions 442, 444 can be distinguished from one another, each of the two third threshold voltage distributions 442, 444 are assigned to one logical information item (e.g., logic "0", logic "1"). In other words, two different memory cell states can be programmed and detected in this kind of memory cell. Thus, it is possible to store only one bit with this kind of memory cell, which is therefore also referred to as a single level cell. The memory cells of FIG. 4C further exhibit relatively narrow third threshold voltage distributions 442, 444 which show a high reliability of these memory cells. In order to distinguish the memory cell programming state, a sufficiently large second read margin (in FIG. 4C denoted with $V_{RD\_MARGIN}$ 446), in which the read voltage may be selected, should be provided. A third read and verify voltage $V_{WL\_MAX}$ 448 that is used for read and verify operations is selected such that it is at least as high as the largest threshold voltage in the threshold voltage distribution 448 with the highest threshold voltage plus the security margin 412.

Figure 4D:
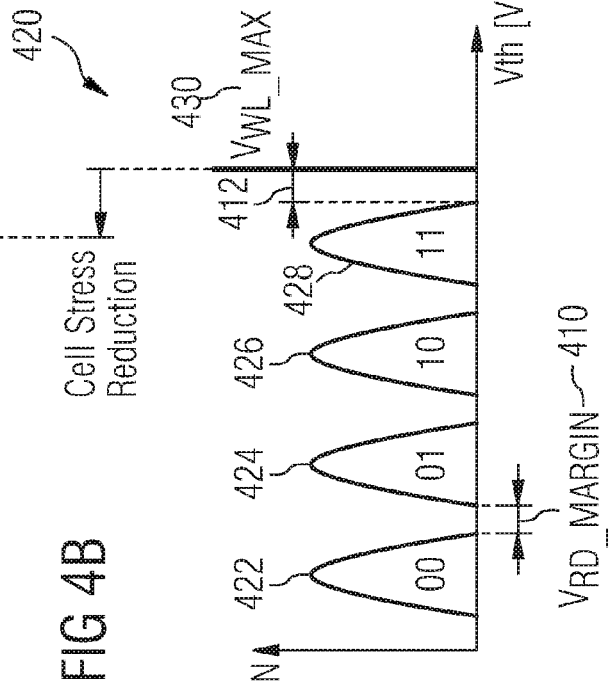

FIG. 4D shows a fourth diagram 460 illustrating the measured threshold voltages of a fourth type of charge trapping memory cell in the same memory cell field as the memory cells taken into account in the diagram of FIGS. 4A to 4C. As can be gathered from FIG. 4D, also two distinguishable fourth threshold voltage distributions 462, 464 can be realized with this kind of charge trapping memory cell. Since the two fourth threshold voltage distributions 462, 464 can be distinguished from one another, each of the fourth threshold voltage distributions 462, 464 is also assigned to one logical information item (e.g., logic "0", logic "1"). In other words, two different memory cell states can be programmed and detected in this kind of memory cell. Thus, it is possible to store only one bit into this kind of memory cell, which is therefore also referred to as a single level cell. The memory cells of FIG. 4D further exhibit broader fourth threshold voltage distributions 462, 464 than the third threshold voltage distributions 442, 444 of the memory cells classified in the third diagram 440, thereby showing a relatively lower reliability of these memory cells classified in the fourth diagram 460 of FIG. 4D as compared with the memory cells classified in the third diagram 440 of FIG. 4C. In order to distinguish the memory cell programming state, a sufficiently large second read margin, which is usually the same for all single level cells, should be provided. Thus, as is shown in FIGS. 4C and 4D, due to the broader fourth threshold voltage distributions 462, 464 using the same read margin and the same security margin 412, the fourth read and verify voltage $V_{WL\_MAX}$ 466 which should at least be provided for the memory cells of FIG. 4D is higher than the third read and verify voltage $V_{WL\_MAX}$ 448 used for reading/verifying the memory cells of FIG. 4C.

In accordance with one embodiment of the invention, the difference between the third read and verify voltage $V_{WL\_MAX}$ 448 required for reading/verifying the memory cells classified into the third diagram 440 and the fourth read and verify voltage $V_{WL\_MAX}$ 466 required for reading/verifying the memory cells classified into the fourth diagram 460 is taken into account. In other words, in one embodiment of the invention, the memory cells classified into a third memory cell class, threshold voltage distributions 442, 444 of which are, e.g., shown in the third diagram 440, are read/verified using a lower word line voltage (e.g., the third read and verify voltage $V_{WL\_MAX}$ 448) than the memory cells classified into a fourth memory cell class, threshold voltage distributions 462, 464 of which are, e.g., shown in the fourth diagram 460, which are read/verified using a higher word line voltage (e.g., the fourth read and verify voltage $V_{WL\_MAX}$ 466). Thus, the memory cells having the narrower third threshold voltage distributions 442, 444 are accessed with lower word line voltages, thereby reducing their memory cell stress.

Thus, in one embodiment of the invention, together with the margin used to read the memory cell information in a reliable manner, the word line voltages for reading and verifying the memory cells are set to fulfill an improvement with regard to the following requirements:

1) multi level cell usage with high reliability;
2) multi level cell usage with low reliability;
3) single level cell usage with high reliability;
4) single level cell usage with low reliability.

In one embodiment of the invention, the digital trimming values, that is the digital values representing the respective programming voltages to be used, are stored in a non-volatile memory such as a one-time programmable memory area of the non-volatile memory arrangement and are loaded therefrom upon power up of the non-volatile memory arrangement.

Referring now back to FIG. 3, at 306, the magnitude of the word line voltage that can be used for reading the memory cells connected to a particular word line is set to be just slightly larger than the threshold voltage having largest magnitude in the threshold voltage distribution of the memory cells connected to the respective word line. Thus, the magnitude of the word line voltage is dependent on the threshold voltage distribution of the memory cells connected to the word line, and more particularly, is dependent on the memory cell having the threshold voltage with the largest magnitude. The magnitude of the word line voltage is assigned to a respective word line voltage identifier, which is a digital value and the assigned digital value is stored in a non-volatile memory as described above together with the address of the memory cell or the word line number, the digital value and the corresponding word line voltage the digital value refers to.

At 308 the stored digital value is determined (e.g., read from the respective word line voltage identifier for the memory cell of interest or word line of interest) representing the lowest magnitude analog voltage value that is larger than the magnitude of the word line voltage.

At 310, the determined stored digital value is used to obtain the applied word line voltage for the memory cell that should be accessed.

At 312, for each word line, the determined stored digital value is converted to an analog word line voltage and the word line voltage is applied to the respective word line.

At 314, the memory cell(s) on the word line being accessed is (are) read. Thus the memory cells connected to a particular word line are read by applying a word line voltage dependent on the threshold voltage distribution of only the memory cells connected to this particular word line. Even more specifically, the word line voltage is dependent on the largest threshold voltage in the threshold voltage distribution of only the memory cells connected to that particular word line. Similarly, the memory cells connected to another word line can be read by applying a word line voltage dependent only on the threshold voltage distribution of the memory cells connected to this other word line.

Optionally at 316, the memory cells connected to a particular word line are programmed by applying a word line voltage dependent only on the threshold voltage distribution of the memory cells connected to this word line.

It should be mentioned that the read access operation and the write access operation can be carried out independently from one another or in a combined operation, e.g., first reading the current state, programming a predetermined state, comparing the measured resistances, thereby determining the logic value that has been stored in the respective memory cell, and then programming the memory cell state again that has first been read.

Since the word line voltage that is used is dependent only on the largest threshold voltage in the threshold voltage distribution of the memory cells connected to the word line being read, in many cases a lower word line voltage can be used when compared to the conventional case when the same word line voltage is applied to all of the word lines for reading the memory cells of the memory cell array. By independently adapting each applied word line voltage, the stress is reduced when reading the memory cells of the word line and the reliability of the cells is increased.

The magnitude of the word line voltage that can be used for programming the memory cells connected to a particular word line can be set independently from the value used for reading the memory cells. Once the plurality of word line voltages for reading and the plurality of word line voltages for programming have been determined, these word line voltages can be used for accessing the plurality of memory cells of the memory cell array.

If desired, instead of grouping together only the memory cells connected to one word line, the memory cells connected to one word line and the memory cells connected to at least one other word line could be grouped together, and a threshold voltage distribution including the cells of the two or more word lines could be obtained. The largest threshold voltage measured in the group of memory cells could then be used to determine the word line voltage that will be used for the two or more word lines.

FIG. 5 is a schematic diagram showing a circuit 500 for accessing a plurality of memory cells 502. The memory cells 502 are formed in a memory cell field 504, for example a memory cell array. The memory cell field 504 includes a plurality of word lines 506 connected to the plurality of memory cells 502. Non-volatile storage means formed as a non-volatile storage device, for example, an OTP (one time programmable register) 508 stores a plurality of digital values $[(V_{R\_0}\text{-}V_{R\_(N+1)})$ and $(V_{P\_0}\text{-}V_{P\_(N+1)})]$ representing a plurality of word line voltages. The plurality of digital values includes a plurality of digital values $(V_{R\_0}\text{-}V_{R\_(N+1)})$ representing a plurality of word line voltages for reading the plurality of memory cells 502 and a plurality of digital values $(V_{P\_0}\text{-}V_{P\_(N+1)})$ representing a plurality of word line voltages for programming the plurality of memory cells 502.

In one embodiment of the invention, all components of the circuit 500 are monolithically integrated on one die.

A digital to analog converter 510 converts the plurality of digital values $[(V_{R\_0}\text{-}V_{R\_(N+1)})$ and $(V_{P\_0}\text{-}V_{P\_(N+1)})]$ to a plurality of word line voltages that will be applied to the plurality of word lines 506. Each one of the plurality of digital values $[(V_{R\_0}\text{-}V_{R\_(N+1)})$ and $(V_{P\_0}\text{-}V_{P\_(N+1)})]$ that is selected is dependent on the threshold voltage distribution width of a respective group of a plurality of memory cells 502 as has been previously explained.

A multiplexer circuit 512 (comprising one or a plurality of multiplexers) is supplied with the plurality of digital values $[(V_{R\_0}\text{-}V_{R\_(N+1)})$ and $(V_{P\_0}\text{-}V_{P\_(N+1)})]$. The multiplexer circuit 512 selectively supplies the plurality of digital values $[(V_{R\_0}\text{-}V_{R\_(N+1)})$ and $(V_{P\_0}\text{-}V_{P\_(N+1)})]$ to the digital to analog converter 510 so that the digital to analog converter 510 can convert selected ones of the plurality of digital values $[(V_{R\_0}\text{-}V_{R\_(N+1)})$ and $(V_{P\_0}\text{-}V_{P\_(N+1)})]$ to the plurality of word line voltages. In one embodiment of the invention, the selection by the multiplexer circuit 512 is carried out in accordance to a first select signal 524 (Address Subset ADD <A:B> to control word lines) that identifies the respective word line, a word line voltage should be selected for. In one embodiment of the invention, the first select signal 524 is provided to a select input of a first multiplexer 526 for selecting a stored word line read voltage value $(V_{R\_0}\text{-}V_{R\_(N+1)})$ as well as to a select input of a second multiplexer 528 for selecting a stored word line programming voltage value $(V_{P\_0}\text{-}V_{P\_(N+1)})$. The selected word line read voltage value and the selected word line programming voltage value are provided to a third multiplexer 530. In one embodiment of the invention, the third multiplexer 530 is controlled by a second select signal 532, thereby providing either the selected word line read voltage value or the selected word line programming voltage value to the input of the digital to analog converter 510.

Word line drivers 514 drive the plurality of word line voltages. A word line voltage regulator 516 regulates the plurality of word line voltages. The word line voltage regulator 516 may include an operational amplifier, a first input 518 of which is coupled to the output of the digital to analog converter 510 and a second input 520 of which is coupled to the output 522 of the operational amplifier.

In one embodiment of the invention, during a formatting or testing of a non-volatile memory cell arrangement, the threshold voltage distribution width is measured, after a program operation (program pulse over a certain time period), with the gate voltage $V_{WL0}$ of a respective memory cell. The measurement is carried out with a read operation and is applied to every word line like the programming operation. After this measurement, the threshold voltage distribution width is known and can be used to adjust the word line voltage level to reduce the stress of the memory cell over its lifetime. In other words, in one embodiment of the invention, non-volatile memory cell stress is reduced by adapting the word line voltage used to operate the memory cell regarding the quality of the memory cell coming out of production.

In one embodiment of the invention, the read operations (after having programmed all memory cells) result in a lowest threshold voltage $V_{thL}$ and a highest threshold voltage $V_{thH}$ of the threshold voltage distribution per word line depending on the memory cells connected to the respective word line. The threshold voltage distribution width is defined to be $V_{thH} - V_{thL}$. Depending on the threshold voltage distribution width, the word line voltage is mapped to one out of an arbitrary number of buckets with defined word line voltages which are set for programming and read operations independently. The target is to set the word line voltage as low as possible. By doing this, the reliability of the memory cells can be improved.

In accordance with an exemplary embodiment of the invention, the word line voltage identifiers are stored in the non-volatile storage device 508, for example, an OTP (e.g., one time programmable register). The word line voltage identifiers may be stored as a plurality of digital values $[(V_{R\_0} - V_{R\_(N+1)})$ and $(V_{P\_0} - V_{P\_(N+1)})]$ representing a plurality of word line voltages (e.g., in the form of digital trimming values, that is the digital values representing the respective programming voltages to be used). The word line voltage identifiers and the correspondingly assigned plurality of word line voltages may be stored in a table, e.g., having a structure as depicted in more detail below.

In one embodiment of the invention, there is provided a read table for the read word line voltage identifiers and a programming table for the programming word line voltage identifiers, although one common table or even more than two tables may be provided in alternative embodiments of the invention.

The read table may have the following structure:

| Number of word line | Read word line voltage identifier | Word line voltage value |
|---|---|---|
| 1 | $V_{R\_0}$ | 1 V |
| 2 | $V_{R\_1}$ | 1.5 V |
| ... | ... | ... |
| i | $V_{R\_i}$ | 3 V |
| ... | ... | ... |
| N + 1 | $V_{R\_N+1}$ | 1.5 V |

A word line index i is used to represent the respective word line. In this embodiment, e.g., $V_{R\_0}$ represents the digital read trimming value for the word line 0, $V_{R\_1}$ represents the digital read trimming value for the word line 1, etc.

The write table may have the following structure:

| Number of word line | Word line program voltage identifier | Word line voltage value |
|---|---|---|
| 1 | $V_{P\_0}$ | 10 V |
| 2 | $V_{P\_1}$ | 12.5 V |
| ... | ... | ... |
| i | $V_{P\_i}$ | 11.75 V |
| ... | ... | ... |
| N + 1 | $V_{P\_N+1}$ | 11 V |

A word line index i is used to represent the respective word line. In this embodiment, e.g., $V_{P\_0}$ represents the digital program trimming value for the word line 0, $V_{P\_1}$ represents the digital program trimming value for the word line 1, etc.

Figure 6:
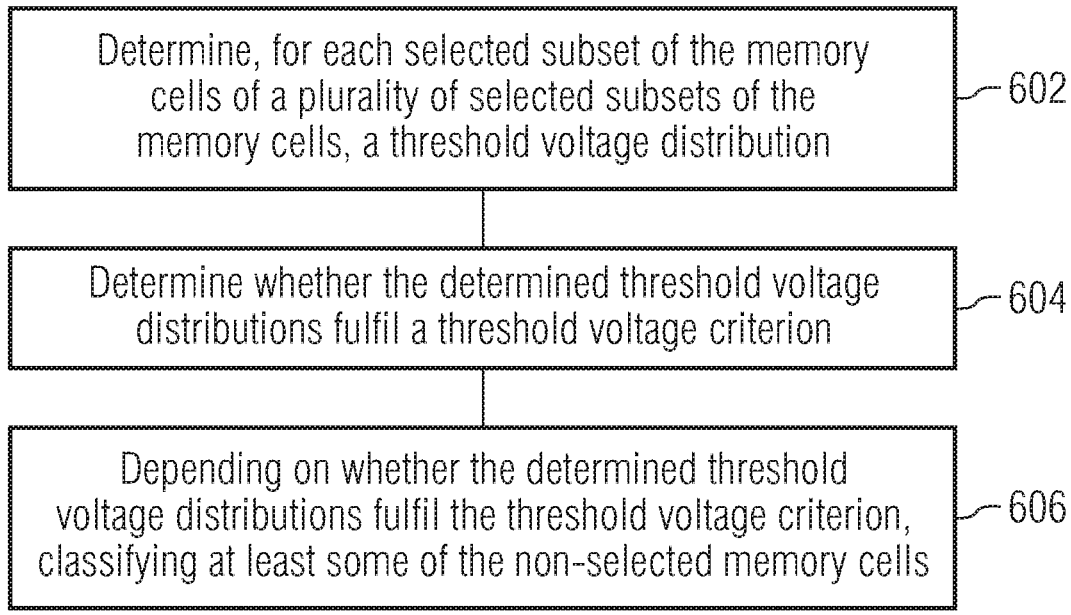
FIG. 6 is a flow diagram illustrating a method for classifying memory cells in a memory cell field in an integrated circuit in accordance with one embodiment of the invention.

Referring now to FIG. 6, in accordance with one embodiment of the invention, a method is provided for classifying, in other words grouping, memory cells in a memory cell field having a plurality of memory cells. As shown in a flow diagram 600, at 602, a threshold voltage distribution is determined for each selected subset of the memory cells of a plurality of subsets of the memory cells. Furthermore, at 604, it is determined whether the determined threshold voltage distributions fulfill a threshold voltage criterion, and at 606, depending on whether the determined threshold voltage distributions fulfill the threshold voltage criterion, at least some or all of the non-selected memory cells are classified. In an embodiment of the invention, a threshold voltage distribution includes a collection of measured threshold voltages for one or a plurality of memory cells in a memory cell field, e.g., a collection of measured threshold voltages for one or a plurality of memory cells coupled to a common line, e.g., coupled to a common word line or common bit line.

In one embodiment of the invention, the classification may be seen in that one or more subsets of memory cells are rejected (in other words classified as erroneous), or the entire memory device may be rejected (in other words classified as erroneous). In this application, the embodiment may be used for testing the memory device.

Figure 7:
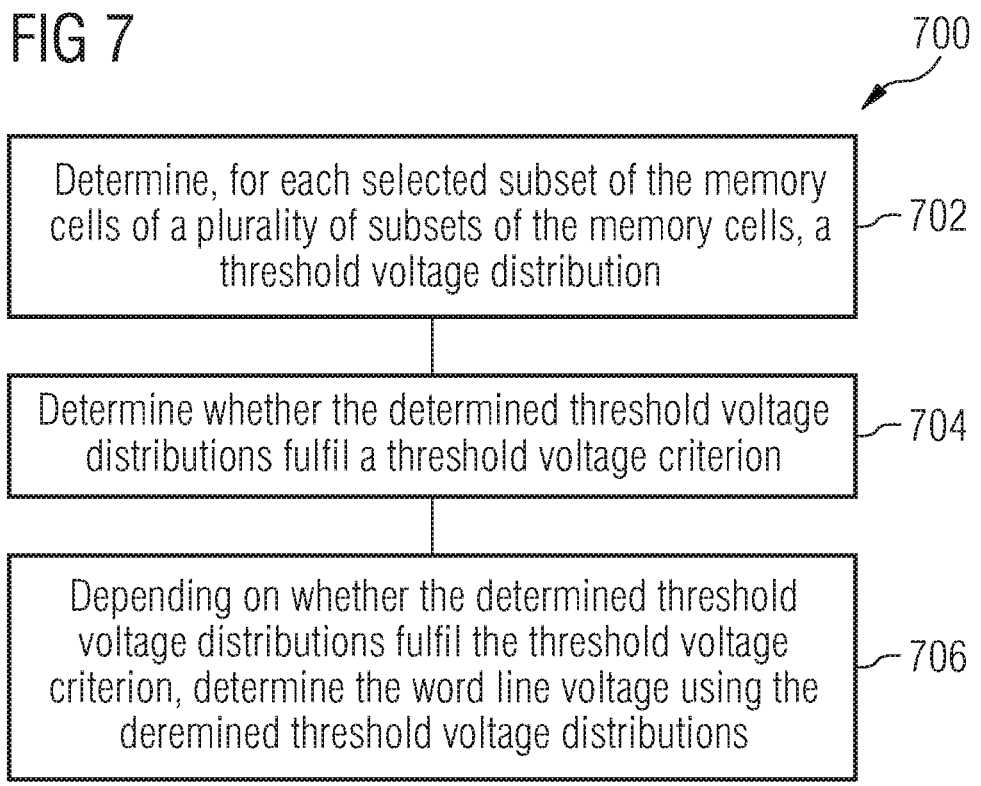
FIG. 7 is a flow diagram illustrating a method for determining a word line voltage for accessing a memory cell in a memory cell field in an integrated circuit in accordance with one embodiment of the invention.

Referring now to FIG. 7, in accordance with one embodiment of the invention, a method is provided for determining a word line voltage for accessing a memory cell in a memory cell field having a plurality of memory cells. As shown in a flow diagram 700, at 702, a threshold voltage distribution is determined for each selected subset of the memory cells of a plurality of subsets of the memory cells. Furthermore, at 704, it is determined whether the determined threshold voltage distributions fulfill a threshold voltage criterion, and at 706, depending on whether the determined threshold voltage distributions fulfill the threshold voltage criterion, the word line voltage is determined using the determined threshold voltage distributions.

In one embodiment of the invention, the determined word line voltage is stored, e.g., in the non-volatile memory device 508, for example, an OTP, as one of a plurality of word line voltages which are assigned to respective word lines for accessing them during a read or programming operation. In this application, the embodiment may be used for determining word line voltages for later use during the operation of the memory device.

Figure 8:
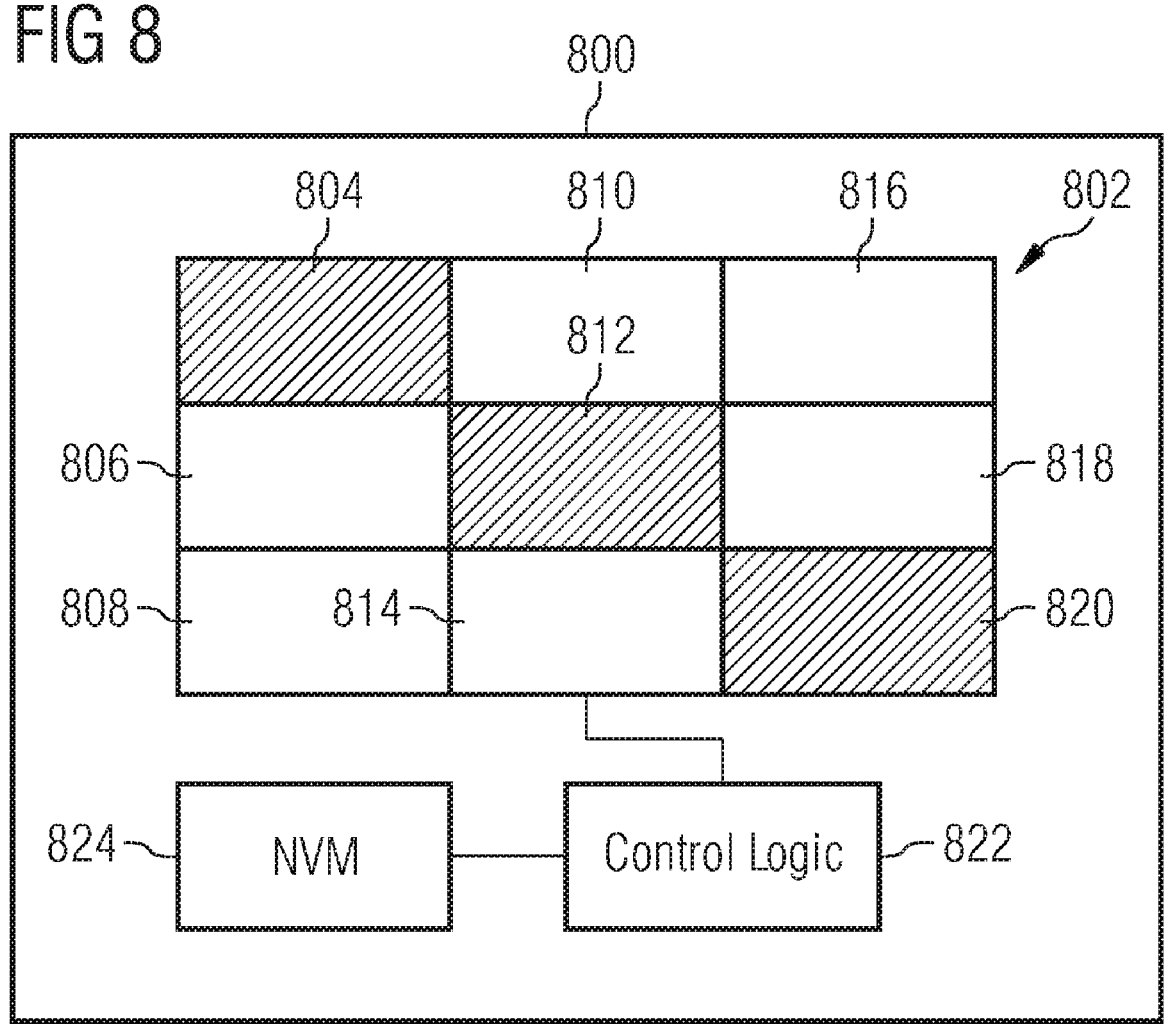
FIG. 8 is a memory cell arrangement in an integrated circuit in accordance with one embodiment of the invention.

Referring now to FIG. 8, in accordance with one embodiment of the invention, a memory cell arrangement 800 is provided. The memory cell arrangement 800 includes a first memory cell region 802, a second memory cell region 824 and a controller 822, e.g., implemented in hard wired logic or by means of a programmable controller such as, e.g., a microcontroller. The first memory cell region 802 includes a plurality of subsets of memory cells, e.g., a plurality of memory cell sectors 804, 806, 808, 810, 812, 814, 816, 818, 820. The memory cell sectors 804, 806, 808, 810, 812, 814, 816, 818, 820 may be, e.g., so-called erase sectors of the first memory cell region 802, in other words regions, which respectively include memory cells, which are simultaneously programmed to a reference programming state. The controller 822 is configured to control the access to the memory cells of the first memory cell region 802, e.g., to control read operations, programming (write) operations or verify operations. To do this, in one embodiment of the invention, the controller 822 uses data that is stored in the second memory cell region 824 that includes, e.g., information about which voltages should be used for which memory cell of the first memory cell region 802 in order to access it, e.g., read it or program it.

In one embodiment of the invention, the controller 822 includes or implements a first determination circuit determining, for each selected subset of the memory cells of a plurality of subsets of the memory cells, a threshold voltage distribution, a second determination circuit determining, whether the determined threshold voltage distributions fulfill a threshold voltage criterion, and/or a classification circuit classifying, depending on whether the determined threshold voltage distributions fulfill the threshold voltage criterion, at least some of the non-selected memory cells. In this case, the memory cell arrangement 800 may act as or be part of a testing device that is testing the memory cells of the first memory cell region 802. In this example, the first memory cell region 802, the second memory cell region 824 and the controller 822 may be integrated on one carrier (e.g., on one substrate, e.g., on one common chip) or may be implemented on individual carriers.

In another embodiment of the invention, the controller 822 includes or implements a word line voltage determination circuit determining a word line voltage for accessing a memory cell in a memory cell field comprising a plurality of memory cells. In this case, the controller 822 may include or implement a first determination circuit determining, for each selected subset of the memory cells of a plurality of subsets of the memory cells, a threshold voltage distribution, a second determination circuit determining, whether the determined threshold voltage distributions fulfill a threshold voltage criterion, and a third determination circuit determining, depending on whether the determined threshold voltage distributions fulfill the threshold voltage criterion, the word line voltage using the determined threshold voltage distributions. In this example, the first memory cell region 802, the second memory cell region 824 and the controller 822 may be integrated on one carrier (e.g., on one substrate, e.g., on one common chip) or may be implemented on individual carriers.

In a conventional wafersort, no adaptation to so called "process of record" changes (POR changes) is possible, since a fixed read margin is conventionally used. For example, when applying single-pulse operations to charge trapping memory cells in the wafersort, however, the actual read margin variation that might occur is not predictable with a high precision. The usage of a fixed read margin would on the one hand decrease the test coverage and on the other hand decrease the yield. Therefore, in accordance with one embodiment of the invention, a read strategy is provided which is adjusted to the optimum read margin while maintaining a low test time being required.

Figure 9:
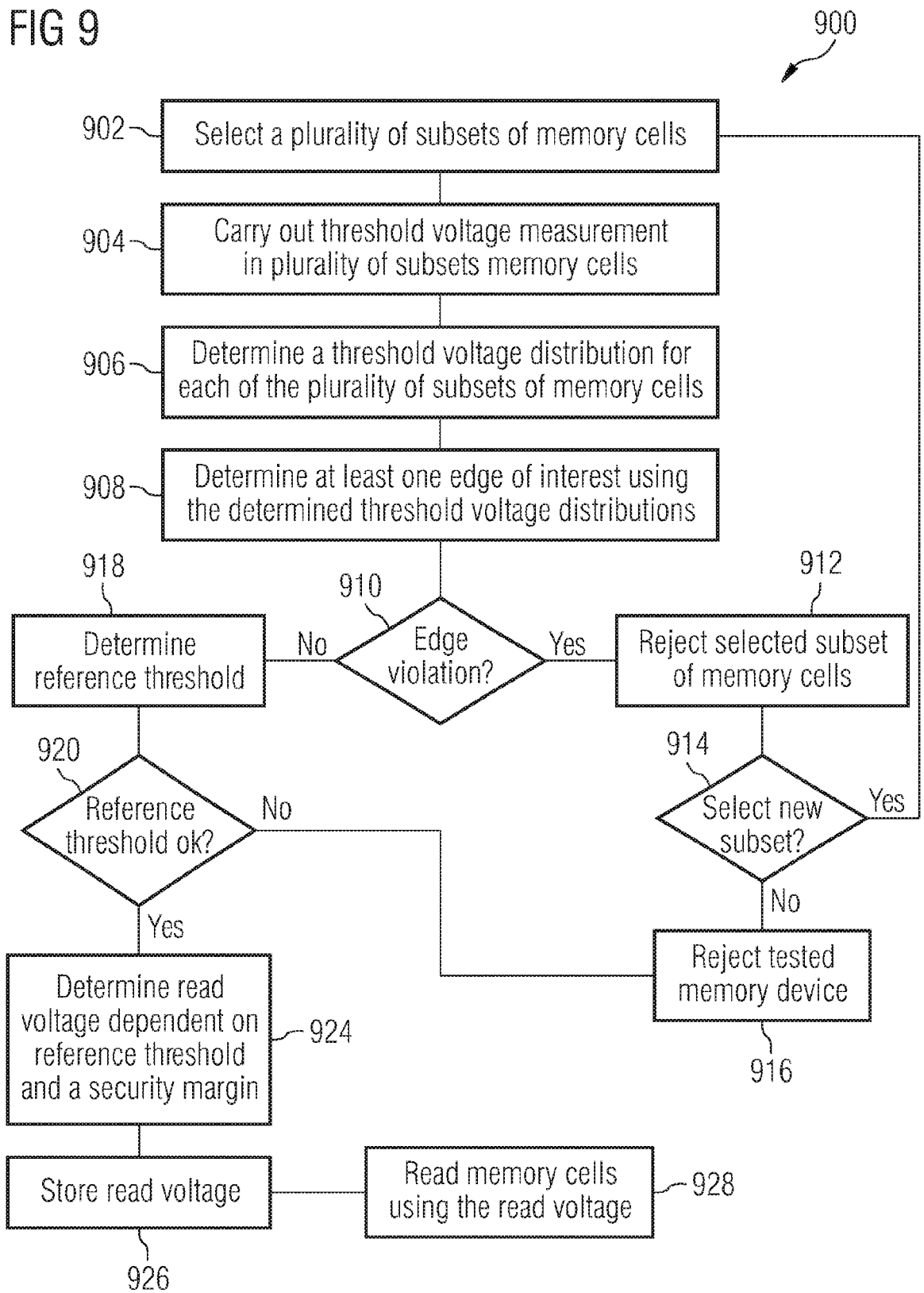
FIG. 9 is a flow diagram illustrating a method for testing an integrated circuit having a memory device in accordance with one embodiment of the invention.

Referring now to FIG. 9, a flow diagram 900 illustrates a method for testing a memory device in accordance with one embodiment of the invention. It should be mentioned that the method may be implemented, carried out or controlled by means of an integrated circuit external tester or by means of an integrated circuit internal logic (e.g., hard wired logic or programmable logic such as a microprocessor), e.g., as a BIST (Built-in-Self-Test).

At 902, a plurality of subsets of memory cells are selected. In other words, a subportion of small areas of a memory cell region is selected for a learn phase. In one embodiment of the invention, a subset corresponds to a respective erase sector of the first memory cell region 802. In one embodiment of the invention, the first memory cell region 802 includes eight erase sectors on one common chip, each erase sector including a plurality of memory cells, e.g., more than one hundred memory cells, e.g., more than one thousand memory cells. In one embodiment of the invention, at least three erase sectors (in FIG. 8 marked as hatched memory cell sectors 804, 812, 820) are selected to be tested in the following process. In accordance with one exemplary embodiment of the invention, the memory cell sectors are selected such that they result in a selected diagonal arrangement over the chip or die (as indicated in FIG. 8). This provides good coverage and little sensitivity to local defects and global defects like global bit line shorts or word line shorts.

In accordance with one embodiment of the invention, an adaptive read margin is provided which is calibrated on a subportion of the entire memory cell field, e.g., on a subportion of the entire memory cell array.

Then, at 904, a threshold voltage measurement is carried out on the memory cells of the plurality of subsets of memory cells that have been selected at 902. The result of this measurement is a plurality of threshold voltage values, each representing the threshold voltage of a respective memory cell transistor.

At 906, a threshold voltage distribution is determined for each subset of memory cells of the plurality of the selected subsets of memory cells. A threshold voltage distribution can be understood as the collection of the determined threshold voltages of a respective subset of memory cells, e.g., the collection of the determined threshold voltages of a respective erase sector. One result of the determination of the threshold voltage distributions is that for each threshold voltage distribution, a threshold voltage distribution width $V_{thH}$-$V_{thL}$ is determined as described above including a minimum threshold voltage $V_{thL}$ of the memory cells of the respective threshold voltage distribution and a maximum threshold voltage $V_{thH}$ of the memory cells of the respective threshold voltage distribution.

At 908, at least one edge of interest is determined in the selected subsets of memory cells using the determined threshold voltage distributions. In accordance with one embodiment of the invention, as an option and for achieving an improved accuracy of the process, the at least one edge of interest is derived from an interpolation line of a certain number of memory cells having a predetermined threshold voltage. The at least one edge of interest may be represented by an interpolated $V_{thLH}$ value. In one embodiment of the invention, one $V_{thLH}$ value is determined for each subset of memory cells of the plurality of the selected subsets of memory cells. In one embodiment of the invention, the $V_{thLH}$ values may be the maximum threshold voltages $V_{thH}$ of the determined threshold voltage distributions or the minimum threshold voltages $V_{thL}$ of the determined threshold voltage distributions. In an alternative embodiment of the invention, the $V_{thLH}$ values of the determined threshold voltage distributions that may be used to determine the interpolated $V_{thLH}$ value may be any threshold voltage value which is measured in the determined threshold voltage distributions. In one embodiment of the invention, the $V_{thLH}$ values of the determined threshold voltage distributions that may be used to determine the interpolated $V_{thLH}$ value may be threshold voltages that lie in the middle region of the determined threshold voltage distributions, since in these region, the determined threshold voltage distributions show the largest steepness, which provides improved statistical characteristics in the determination of the interpolated $V_{thLH}$ value.

Then, at 910, the determined at least one edge of interest is checked for a violation, in other words, it is determined whether the at least one edge of interest fulfills a predefined criterion. The predefined criterion may be a predefined $V_{thLH}$ value tolerance range, which the determined interpolated $V_{thLH}$ value should match. In one particular embodiment of the invention, it is determined, whether the $V_{thLH}$ values for all three selected memory cell sectors 804, 812, 820 lie within the one or more $V_{thLH}$ value tolerance ranges (e.g., in a $V_{thLH}$ value tolerance range of 100 mV around a predefined target $V_{thLH}$ value).

In case it has been determined that the at least one edge of interest fulfills the predefined criterion for the at least one edge of interest ("Yes" in 910), the respectively checked selected memory cell sector 804, 812, 820 is rejected, at 912, (in other words, classified as defect considered to represent threshold voltage distributions in a good area and will not be classified as defect according to the processes described above) and it is determined in 914, whether a new subset of memory cells should be selected or whether it is allowed to reduce the number of selected subsets of memory cells. In case it is neither allowed to select a new subset of memory cells nor to reduce the number of selected subsets of memory cells ("No" in 914), the entire tested memory device, e.g., the first memory cell region 802, is rejected (in other words classified as defect) in 916. In case it is either allowed to select a new subset of memory cells or to reduce the number of selected subsets of memory cells ("Yes" in 914), a new subset of memory cell is selected from the memory cell field, e.g., from the first memory cell region 802, in other words, the process continues in 902. In an alternative embodiment of the invention, the number of selected subsets is reduced.

In case no violation has been determined for the at least one edge of interest ("No" in 910), in 918, a reference threshold is determined, e.g., a reference read voltage margin threshold. In one embodiment of the invention, this can be done by carrying out any statistical analysis on the determined threshold voltage distributions that have been "accepted" in 910. In an embodiment of the invention, a statistical analysis involves the application of probability theory to quantified descriptive data. In an embodiment of the invention, a statistical analysis involves the modeling of randomness and uncertainty by probability theory. In one embodiment of the invention, the statistical analysis may include selecting the median threshold voltage or a statistical average threshold voltage of the determined threshold voltage distributions. In one embodiment of the invention, it is assumed that the $V_{thLH}$ values of the three selected memory cell sectors 804, 812, 820 do not show any violation and the reference threshold is determined as being the median value of the three $V_{thLH}$ values of the three selected memory cell sectors 804, 812, 820. However, in alternative embodiments of the invention, any other statistical analysis method may be used.

At 920, it is determined whether the reference threshold is within a predefined reference tolerance range. In one embodiment of the invention, the predefined reference tolerance is in the range of about 3.2 V to about 4.0 V. It should be mentioned that the predefined reference tolerance range is strongly dependent, e.g., on the process technology, architecture and the type of memory cells used and that the above mentioned numbers are given for illustrating purposes only.

If the reference threshold is not within the predefined reference tolerance range ("No" in 920), the entire tested memory device, e.g., the first memory cell region 802, is rejected (in other words classified as defect) in 916. If the reference threshold is within the predefined reference tolerance range ("Yes" in 920), in 924, a read voltage or a read voltage margin is determined dependent on the reference threshold determined in 918. In one embodiment of the invention, the read voltage or the read voltage margin is determined as a sum of the reference threshold and a predefined read security margin. In one embodiment of the invention, the predefined read security margin is in a range of about 200 mV to about 400 mV, e.g., of about 250 mV to about 350 mV, e.g., 300 mV. In other embodiments of the invention, other values for the predefined read security margin may be provided, if desired. In one embodiment of the invention, the read voltage is determined according to the following equation:

read voltage=median value of the three $V_{thL}$ values+ predefined read security margin.

In another embodiment of the invention it may be provided that the reference threshold is not directly checked against the predefined reference tolerance range, but that the read voltage or the read voltage margin is first calculated as described above and that the calculated read voltage or the read voltage margin is then checked against a predefined read voltage reference tolerance range, which may then of course include another value than the predefined reference tolerance range mentioned above.

In case that the read voltage or the read voltage margin is in an acceptable tolerance range, in 926, the determined read voltage or the read voltage margin is stored in a memory, e.g., in a non-volatile memory, e.g., in the non-volatile memory 824 or in the non-volatile storage device 508. Then, in 928, in one embodiment of the invention, whenever a memory cell of the entire memory cell field 802 is read, the determined read voltage or the read voltage margin is used for accessing the respective memory cell (the memory cells of the selected sectors as well as the memory cells of the non-selected sectors). The memory 824 does not need to be a non-volatile memory. In an alternative embodiment of the invention, the $V_t$ information may also be temporarily stored by the tester by means of an integrated circuit internal volatile memory such as, e.g., by means of an integrated circuit internal static random access memory (SRAM).

In one embodiment of the invention, this process is used in a margin read of a checkerboard distribution test. In this context it should be noted that in order to save test time, the checkerboard margin read can be done with two reference memory cells in parallel, if available and technically possible, e.g., for multi level devices.

An effect of an embodiment of the invention, according to which it is used for testing a memory die or individual memory cell fields of a memory die (e.g., in a checkerboard wafer test) is the low test time impact due to the above-described learn phase on only a portion of the entire memory die or memory cell fields. Furthermore, a high testing accuracy can be achieved due to the interpolation line and median value calculation in accordance with one embodiment of the invention. Furthermore, one embodiment of the invention provides a process which is adaptive to "process of record" changes (POR changes) as well as to lot and wafer variations.

Figure 10:
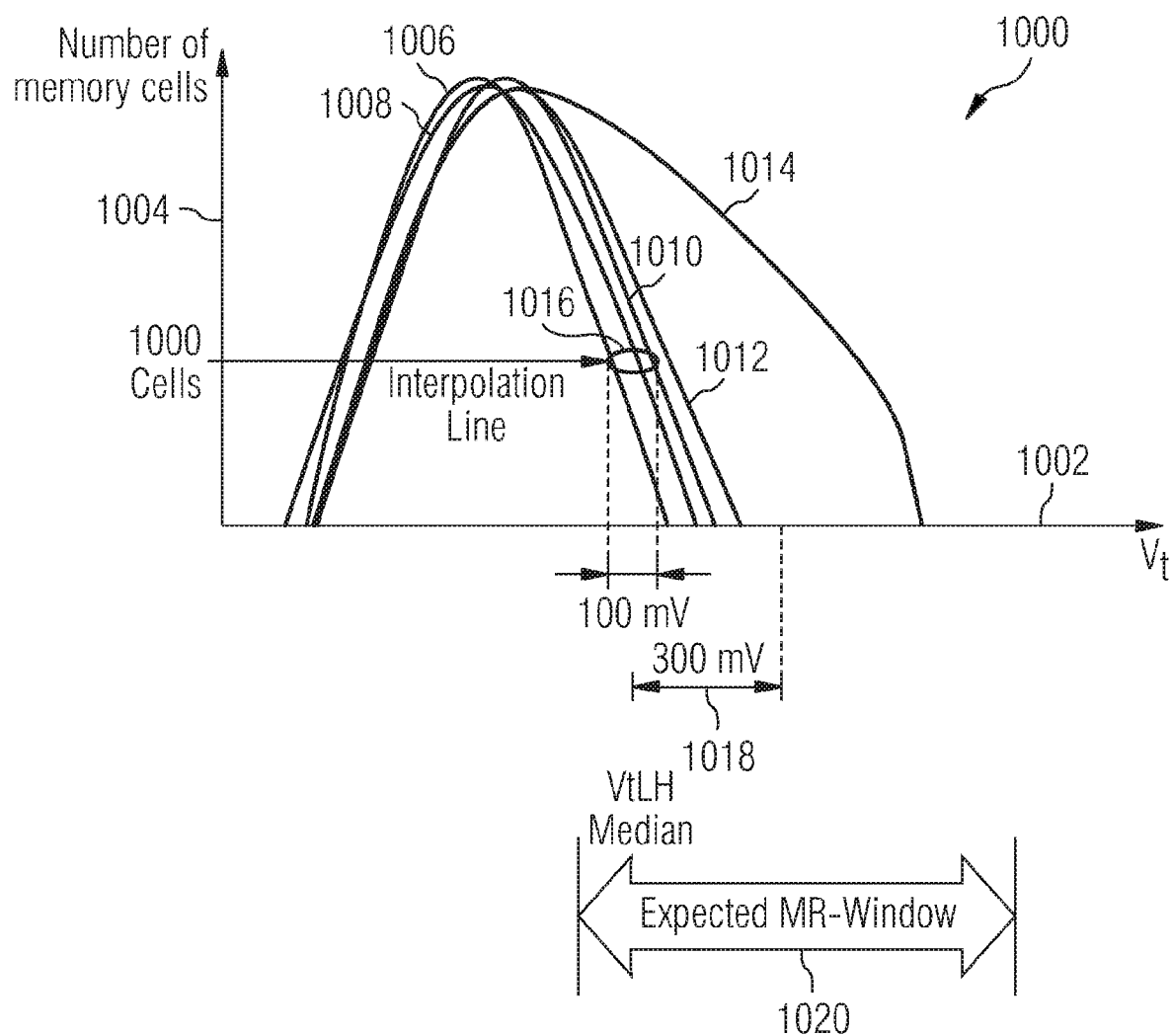
FIG. 10 is a diagram illustrating an adaptive read margin in accordance with one embodiment of the invention.

FIG. 10 shows a diagram 1000 illustrating an adaptive read margin in accordance with one embodiment of the invention. A first axis 1002 of the diagram 1000 shows the threshold voltages of the memory cells that has been measured and a second axis 1004 shows the number of memory cells of a respective memory cell sector that have the respective threshold voltage. Furthermore, FIG. 10 shows a plurality of threshold voltage distributions 1006, 1008, 1010, 1012, 1014. As shown in FIG. 10, the threshold voltage distributions 1006, 1008, 1010, 1012 are considered to represent threshold voltage distributions in a good area and will not be classified as defect according to the processes described above and the threshold voltage distribution 1014 is considered to represent a threshold voltage distribution in a defect area and will not be classified as defect according to the processes described above. In one embodiment of the invention, the selected subsets include the threshold voltage distributions 1006, 1008, 1010 and thereby represent a learn area 1016 within the memory cell field 802, for example.

Furthermore, in accordance with one embodiment of the invention, the interpolated $V_{thLH}$ value is determined as the median value of the threshold voltage values ($V_{thLH}$ values) that a predetermined number of cells in the selected subsets of memory cells show (e.g., 1000 cells, although any other number may be used in an alternative embodiment of the invention). In an alternative embodiment of the invention, also the maximum threshold voltages $V_{thH}$ of the determined threshold voltage distributions or the minimum threshold voltages $V_{thL}$ of the determined threshold voltage distributions may be used for determining the interpolated $V_{thLH}$ value.

Furthermore, an example of the read voltage margin 1018 is shown in FIG. 10 as well as an example of a $V_{thLH}$ value tolerance range 1020. It should be noted that any other voltages may be selected in accordance with an alternative embodiment of the invention.

It should be appreciated by those skilled in the art, that the described processes may be implemented in hardware, software, firmware or a combination of these implementations as appropriate. For example, the operation of selecting a memory cell may be carried out by word and bit-line decoders under the control of an I/O interface circuit such as a computer. Accordingly, the described operations may be implemented as executable instructions stored on a computer readable medium (removable disk, volatile or non-volatile memory, embedded processors, etc.), the stored instruction code operable to program a computer or other such programmable device to carry out the intended functions.

Figure 11A:
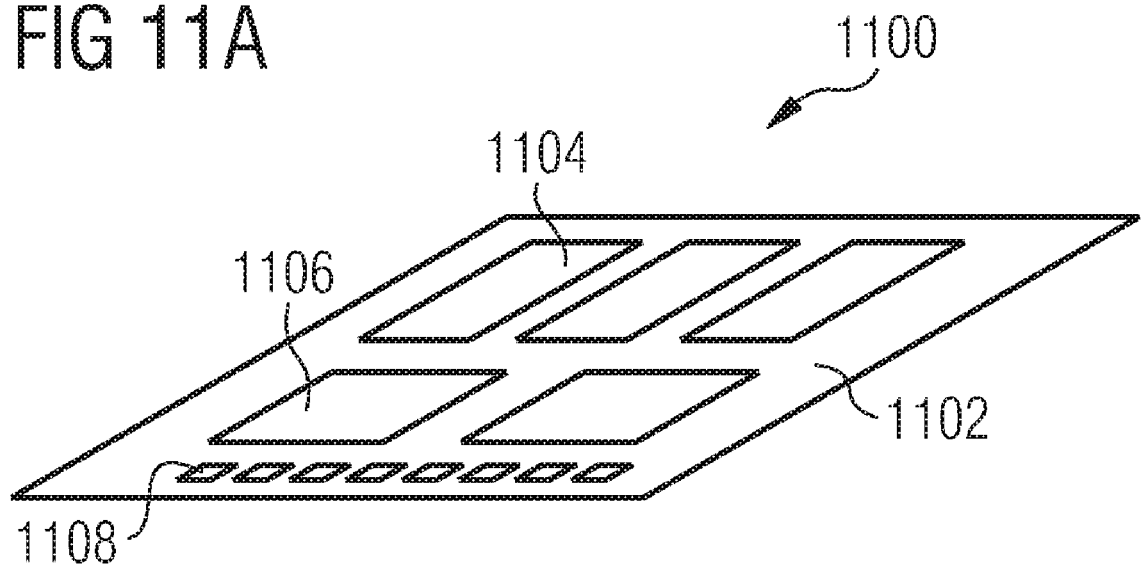
FIGS. 11A and 11B show a memory module (FIG. 11A) and a stackable memory module (FIG. 11B) in accordance with an embodiment of the invention.
Figure 11B:
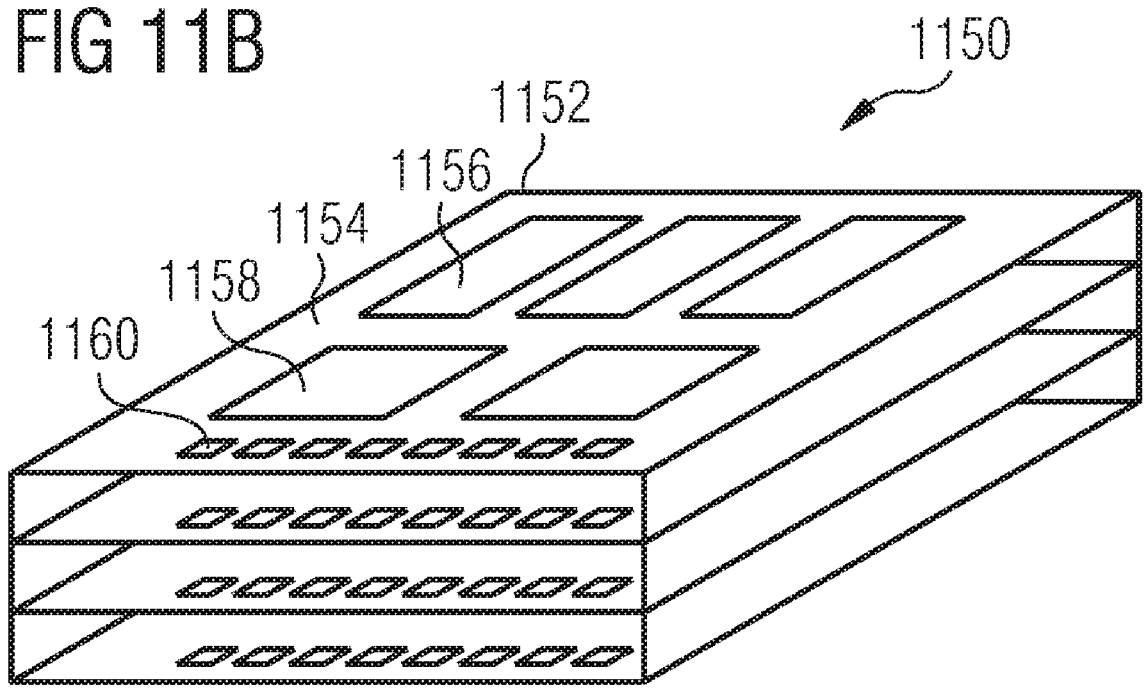

As shown in FIGS. 11A and 11B, in some embodiments, memory devices such as those described herein may be used in modules. In FIG. 11A, a memory module 1100 is shown, on which one or more memory devices 1104 are arranged on a substrate 1102. The memory device 1104 may include numerous memory cells, each of which uses a memory element in accordance with an embodiment of the invention. The memory module 1100 may also include one or more electronic devices 1106, which may include one or more memories, one or more processing circuitries, one or more control circuitries, one or more addressing circuitries, one or more bus interconnection circuitries, or one or more other circuitries or electronic devices that may be combined on a module with a memory device, such as the memory device 1104. Additionally, the memory module 1100 includes multiple electrical connections 1108, which may be used to connect the memory module 1100 to other electronic components, including other modules.

As shown in FIG. 11B, in some embodiments, these modules may be stackable, to form a stack 1150. For example, a stackable memory module 1152 may contain one or more memory devices 1156, arranged on a stackable substrate 1154. The memory device 1156 contains memory cells that employ memory elements in accordance with an embodiment of the invention. The stackable memory module 1152 may also include one or more electronic devices 1158, which may include one or more memories, one or more processing circuitries, one or more control circuitries, one or more addressing circuitries, one or more bus interconnection circuitries, or one or more other circuitries or electronic devices that may be combined on a module with a memory device, such as the memory device 1156. Electrical connections 1160 are used to connect the stackable memory module 1152 with other modules in the stack 1150, or with other electronic devices. Other modules in the stack 1150 may include additional stackable memory modules, similar to the stackable memory module 1152 described above, or other types of stackable modules, such as stackable processing modules, control modules, communication modules, or other modules containing electronic components.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined solely by the claims appended hereto.

What is claimed is:

1. A method of accessing an integrated circuit having a plurality of memory cells, the method comprising:
   for each one of a plurality of word lines, accessing a plurality of memory cells connected to that word line by applying a word line voltage dependent on a threshold voltage distribution of the plurality of memory cells connected to that word line,
   reading one of a plurality of stored digital values, each one of the plurality of digital values representing a word line voltage value; and
   digital to analog converting a selected one of the plurality of digital values to obtain the word line voltage applied to the one of the plurality of word lines,
   wherein the plurality of memory cells comprises a plurality of non-volatile memory cells.

2. A method of determining a set of word line voltage identifiers in an integrated circuit, the method comprising:
   determining threshold voltages from a plurality of memory cells of a memory cell field;
   assigning a plurality of word line voltage identifiers to the determined threshold voltages, each word line voltage identifier representing a word line voltage to be used when accessing a memory cell of the plurality of memory cells and each word line voltage identifier being assigned to at least one of the memory cells in the memory cell field; and
   storing the plurality of word line voltage identifiers as a set of word line voltage identifiers.

3. The method according to claim 2, wherein storing the plurality of word line voltage identifiers comprises storing the plurality of word line voltage identifiers in a non-volatile memory.

4. The method according to claim 3, wherein storing the plurality of word line voltage identifiers in a non-volatile memory comprises storing the plurality of word line voltage identifiers in a read only memory.

5. The method according to claim 4, wherein storing the plurality of word line voltage identifiers in a read only memory comprises storing the plurality of word line voltage identifiers in a one-time programmable memory.

6. A method for classifying memory cells in an integrated circuit, the integrated circuit having a memory cell field comprising a plurality of memory cells, the method comprising:
   determining, for each subset of the memory cells of a plurality of subsets of the memory cells, a threshold voltage distribution;
   determining whether the determined threshold voltage distributions fulfill a threshold voltage criterion; and
   depending on whether the determined threshold voltage distributions fulfill the threshold voltage criterion, classifying at least some of the non-selected memory cells.

7. A method for accessing a memory cell in an integrated circuit, the integrated circuit having a memory cell field comprising a plurality of memory cells which memory cells are classified in accordance with the method as claimed in claim 6, the method for accessing a memory cell comprising:
   selecting a word line voltage identifier from a pre-stored set of word line voltage identifiers, each word line voltage identifier of the pre-stored set of word line voltage identifiers being assigned to at least one of the memory cells in the memory cell field; and
   accessing the memory cell using a word line voltage being dependent on the selected word line voltage identifier.

8. The method according to claim 7, wherein each word line voltage identifier of the pre-stored set of word line voltage identifiers is dependent on predetermined threshold voltages of at least one of the memory cells.

9. The method according to claim 7, wherein each word line voltage identifier of the pre-stored set of word line voltage identifiers is dependent on a distribution of predetermined threshold voltages of a plurality of the memory cells.

10. The method according to claim 7, wherein the plurality of memory cells comprise a plurality of non-volatile memory cells.

11. The method according to claim 10, wherein the plurality of memory cells comprise a plurality of non-volatile flash memory cells.

12. The method according to claim 7, wherein each one of the word line voltage identifiers comprises a digital value that represents an analog voltage value, the method further comprising:
   obtaining the used word line voltage by digital to analog converting the plurality of digital values.

13. The method according to claim 7, wherein accessing the memory cell comprises reading the memory cell using the word line voltage being dependent on the selected word line voltage identifier.

14. The method according to claim 7, wherein accessing the memory cell comprises writing the memory cell using the word line voltage that is dependent on the selected word line voltage identifier.

15. The method according to claim 6, wherein the plurality of memory cells comprise a plurality of non-volatile memory cells.

16. The method according to claim 6, wherein the plurality of memory cells comprise a plurality of non-volatile flash memory cells.

17. The method according to claim 6, further comprising determining a reference threshold voltage using the determined threshold voltage distributions, the threshold voltage criterion being dependent on the reference threshold voltage.

18. The method according to claim 17, wherein the determining the reference threshold voltage comprises using a statistical analysis of the determined threshold voltage distributions.

19. The method according to claim 18, wherein the statistical analysis comprises selecting a median threshold voltage or a statistical average threshold voltage of the determined threshold voltage distributions.

20. The method according to claim 17, further comprising:
   determining whether the reference threshold voltage fulfills a reference threshold voltage criterion; and
   depending on whether the reference threshold voltage fulfills the reference threshold voltage criterion, classifying at least some of the non-selected memory cells.

21. The method according to claim 6, wherein classifying at least some of the non-selected memory cells comprises classifying all memory cells of the memory cell field.

22. A method for determining a word line voltage for accessing a memory cell in an integrated circuit, the integrated circuit having a memory cell field comprising a plurality of memory cells, the method comprising:
   determining, for each subset of the memory cells of a plurality of subsets of the memory cells, a threshold voltage distribution;
   determining whether the determined threshold voltage distributions fulfill a threshold voltage criterion; and
   depending on whether the determined threshold voltage distributions fulfill the threshold voltage criterion, determining the word line voltage using the determined threshold voltage distributions.

23. The method according to claim 22, further comprising determining a reference threshold voltage using the determined threshold voltage distributions, the threshold voltage criterion being dependent on the reference threshold voltage.

24. The method according to claim 23, wherein determining the reference threshold voltage comprises using a statistical analysis of the determined threshold voltage distributions.

25. The method according to claim 24, wherein the statistical analysis comprises selecting a median threshold voltage or a statistical average threshold voltage of the determined threshold voltage distributions.

26. The method according to claim 23, further comprising:
   determining whether the reference threshold voltage fulfills a reference threshold voltage criterion; and
   depending on whether the reference threshold voltage fulfills the reference threshold voltage criterion, determining the word line voltage using the reference threshold voltage.

27. The method according to claim 26, wherein determining the word line voltage using the reference threshold voltage comprises determining the word line voltage using the reference threshold voltage plus a predetermined security margin value.

* * * * *